US012193337B2

United States Patent
Ou et al.

(10) Patent No.: US 12,193,337 B2
(45) Date of Patent: Jan. 7, 2025

(54) SEMICONDUCTOR DEVICE AND METHOD OF FABRICATING THE SAME

(71) Applicant: Winbond Electronics Corp., Taichung (TW)

(72) Inventors: Wen-Chia Ou, Taichung (TW); Chih-Chao Huang, Taichung (TW); Min-Chih Wei, Taichung (TW); Yu-Ting Chen, Taichung (TW); Chi-Ching Liu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 149 days.

(21) Appl. No.: 16/991,055

(22) Filed: Aug. 12, 2020

(65) Prior Publication Data
US 2021/0057640 A1 Feb. 25, 2021

(30) Foreign Application Priority Data

Aug. 22, 2019 (TW) ................................. 108130117

(51) Int. Cl.
H10N 50/80 (2023.01)
H10B 61/00 (2023.01)
H10N 50/01 (2023.01)

(52) U.S. Cl.
CPC ............. *H10N 50/80* (2023.02); *H10B 61/22* (2023.02); *H10N 50/01* (2023.02)

(58) Field of Classification Search
CPC ....... H01L 43/02; H01L 27/228; H01L 43/12; H10N 50/80
See application file for complete search history.

(56) References Cited

U.S. PATENT DOCUMENTS 10,163,981 B2 * 12/2018 Chen .................. H01L 45/1608
2003/0030084 A1    2/2003 Moise et al.
2014/0061573 A1 *  3/2014 Mikawa ............... H10N 70/011
257/4

(Continued)

FOREIGN PATENT DOCUMENTS

CN    100428477    10/2008
CN    106876423    6/2017

(Continued)

OTHER PUBLICATIONS

"Office Action of China Counterpart Application", issued on May 31, 2023, p. 1-p. 7.

*Primary Examiner* — Trang Q Tran
(74) *Attorney, Agent, or Firm* — JCIPRNET (57) ABSTRACT

A method of fabricating a semiconductor device includes the following steps. A plurality of doped regions are formed in a substrate. A first dielectric layer is formed on the substrate. A plurality of first contacts and second contacts are formed in the first dielectric layer to be connected to the plurality of doped regions. A memory element is formed on the first dielectric layer. The memory element is electrically connected to the second contact. A second dielectric layer is formed on the first dielectric layer. The second dielectric layer surrounds the memory element. A conductive line is formed in the second dielectric layer. A top surface of the conductive line is at a same level as a top surface of the memory element, and the conductive line is electrically connected to the plurality of first contacts.

6 Claims, 9 Drawing Sheets

(56) References Cited

U.S. PATENT DOCUMENTS

| | | | | |
|---|---|---|---|---|
| 2017/0084820 A1* | 3/2017 | Tan | .......................... | H01L 43/12 |
| 2017/0092692 A1* | 3/2017 | Kalnitsky | ............. | G01R 33/098 |
| 2018/0040817 A1* | 2/2018 | Chuang | .................. | H10N 70/20 |
| 2018/0374895 A1* | 12/2018 | Hsu | ........................ | H10N 50/80 |

FOREIGN PATENT DOCUMENTS

| | | |
|---|---|---|
| CN | 107039483 | 8/2017 |
| TW | 200939458 | 9/2009 |
| TW | 201724490 | 7/2017 |
| TW | 201729414 | 8/2017 |

* cited by examiner

SEMICONDUCTOR DEVICE AND METHOD OF FABRICATING THE SAME

CROSS-REFERENCE TO RELATED APPLICATION

This application claims the priority benefit of Taiwan application serial no. 108130117, filed on Aug. 22, 2019. The entirety of the above-mentioned patent application is hereby incorporated by reference herein and made a part of this specification.

BACKGROUND OF THE INVENTION

Field of the Invention

The disclosure relates to an integrated circuit and a method of fabricating the same, and in particular, to a semiconductor device and a method of fabricating the same.

Description of Related Art

With the progress of sciences and technologies, various electronic products have been developed towards high speed, high efficiency, lightweight, thinness, shortness and miniaturization. How to effectively utilize a chip area and improve the yield is a very important subject at present.

In recent years, resistive memory (for example, resistive random access memory (RRAM)) has been developed very rapidly and become the most popular future memory structure at present. The resistive memory has the potential advantages of low power consumption, high operating speed, high density and compatibility with a complementary metal oxide semiconductor (CMOS) process technology and thus is quite suitable to be used as a next-generation non-volatile memory.

However, in a semiconductor fabrication process, after the resistive memory is formed, a depth of one via on the resistive memory is different from a depth of an adjacent via. As a result, different via depths may easily cause etching problems, or cause different via sizes and even cause the problems of excessively high contact resistance and the like.

SUMMARY OF THE INVENTION

Embodiments of the invention provide a semiconductor device and a method of fabricating the same. The etching problems, different via sizes and the problems of excessively high contact resistance and the like caused by different depths of a via connecting a memory cell and a via connecting a conductor layer may be avoided.

The embodiments of the invention provide a method of fabricating a semiconductor device, which includes the following steps: forming a plurality of doped regions in a substrate; forming a first dielectric layer on the substrate; forming a plurality of first contacts and second contacts in the first dielectric layer to connect to the plurality of doped regions; forming a memory element on the first dielectric layer, the memory element being electrically connected to the second contact; forming a second dielectric layer on the first dielectric layer, the second dielectric layer surrounding the memory element; and forming a conductive line in the second dielectric layer, a top surface of the conductive line being at a same level as a top surface of the memory element, and the conductive line being electrically connected to the plurality of first contacts.

The embodiments of the invention provide a semiconductor device, which includes: a plurality of doped regions, located in a substrate; a first dielectric layer, located on the substrate; first contacts and second contacts, located in the first dielectric layer and connected to the doped regions; a second dielectric layer, located on the first dielectric layer; a memory element, located in the second dielectric layer, the memory element being electrically connected to the second contact; and a conductive line, located in the second dielectric layer, the conductive line being electrically connected to the first contacts, and a top surface of the conductive line being at a same level as a top surface of the memory element.

Based on the above, according to the embodiments of the invention, vias connecting a memory cell and connecting a conductor layer are the same in depth, so that the depths and sizes of the vias may be effectively controlled, and contact resistance may be reduced.

In order to make the aforementioned and other objectives and advantages of the invention comprehensible, embodiments accompanied with figures are described in detail below.

DESCRIPTION OF THE EMBODIMENTS

Figure 1A:
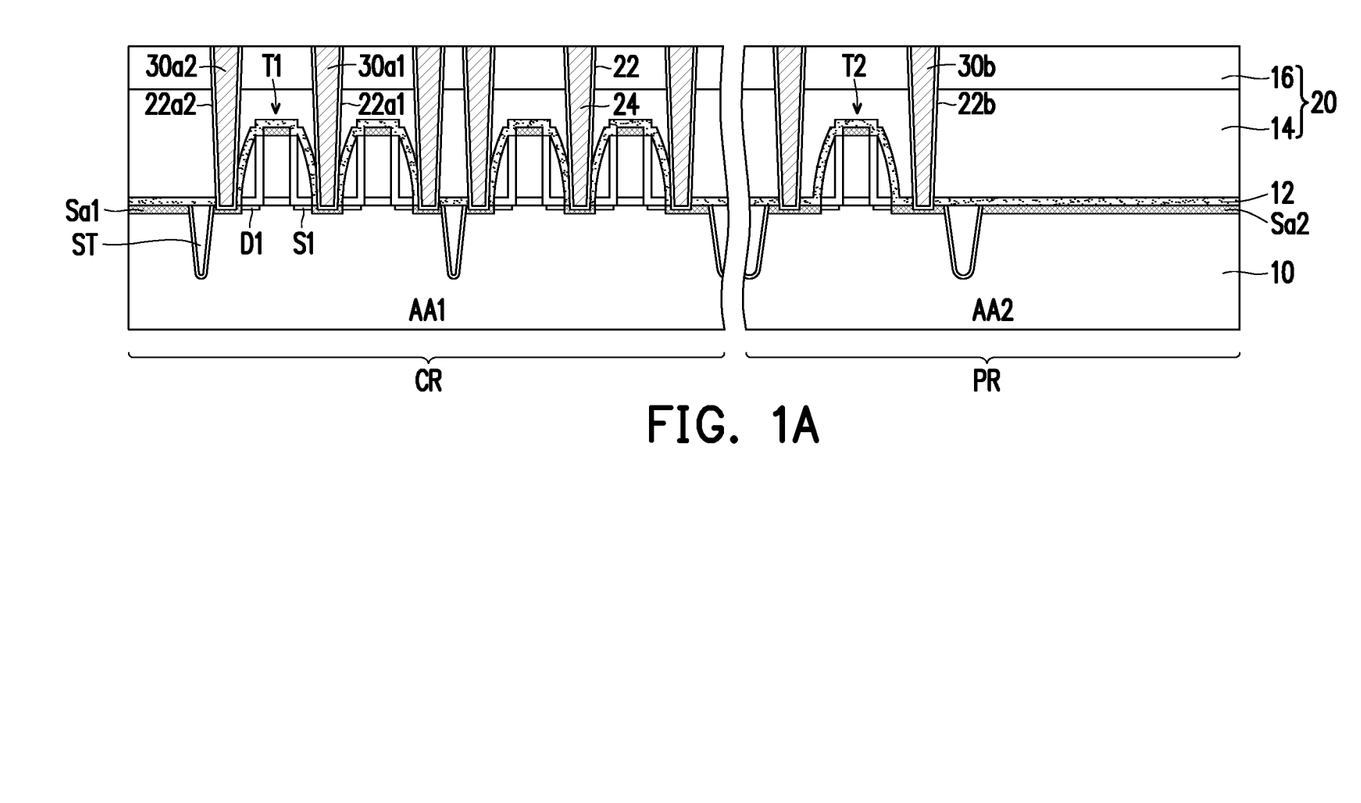
FIG. 1A to FIG. 1G are cross-sectional views of a process for fabricating a semiconductor device according to an embodiment of the invention.

Referring to FIG. 1A, a substrate 10 is provided. The substrate 10 may be a semiconductor substrate 10 or a silicon on insulator (SOI) substrate 10. The substrate 10 may include a memory cell region CR and a peripheral region PR. The memory cell region CR is also called an array region. A plurality of isolation structures ST and a plurality of first transistors T1 and second transistors T2 are formed in the memory cell region CR and the peripheral region PR. Materials for the isolation structures ST include silicon oxide. The isolation structures ST define an active region AA1 in the substrate 10 in the memory cell region CR and define an active region AA2 in the substrate 10 in the peripheral region PR.

Then, a first etch stop layer 12 and a first inter-layer dielectric layer 20 are formed on the substrate 10. The first etch stop layer 12 is, for example, a silicon nitride layer. The first inter-layer dielectric layer 20 sequentially includes, for example, a first dielectric layer 14 and a second dielectric layer 16. The first dielectric layer 14 is, for example, undoped spin-on glass. The second dielectric layer 16 is, for example, a flat layer formed by planarizing silicon oxide formed from tetraethoxysilane (TEOS) as a gas source through a planarization process.

Next, contacts 30a1 and 30a2 being in contact with first metal silicide layers Sa1 of the first transistors T1 are formed in the first inter-layer dielectric layer 20 and the first etch stop layer 12 of the memory cell region CR, and contacts 30b being in contact with second metal silicide layers Sa2 of the second transistors T2 are formed in the first inter-layer dielectric layer 20 of the peripheral region PR.

Figure 1B:
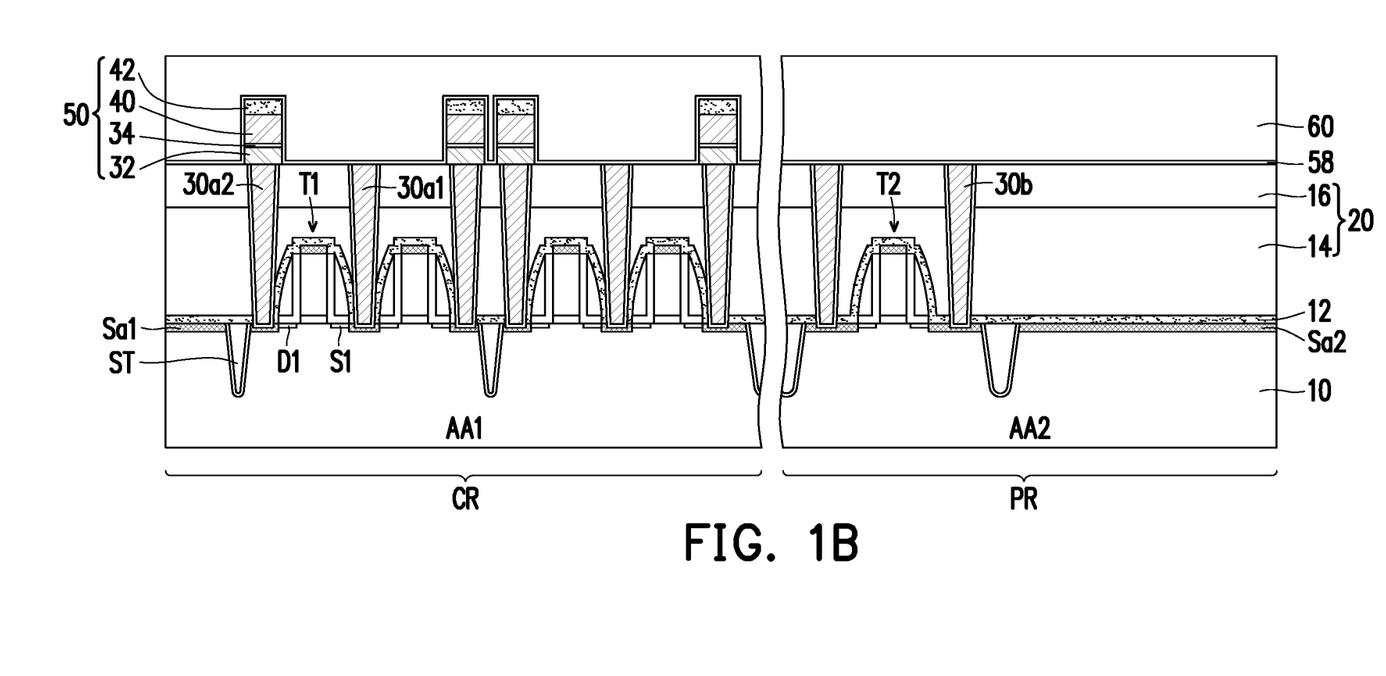

Later on, memory elements 50 are formed on the substrate 10, as shown in FIG. 1B. The memory elements 50 are located on the substrate 10 in the memory cell region CR. The memory elements 50 are electrically connected to drain regions D1 of the first transistors T1 through the contacts 30a2. The memory element 50 may be a resistive memory or a magneto-resistive memory, etc. The memory element 50 includes a first electrode layer 32, an insulating layer 34, a second electrode layer 40 and a top cover layer 42.

Referring to FIG. 1B, then, a barrier layer 58 and a second inter-layer dielectric layer 60 are formed on the memory element 50 and the first inter-layer dielectric layer 20. A material for the barrier layer 58 is, for example, titanium oxynitride, alumina, hafnium oxide, zirconia or a combination thereof. The second inter-layer dielectric layer 60 may be, for example, a silicon oxide layer.

Figure 1C:
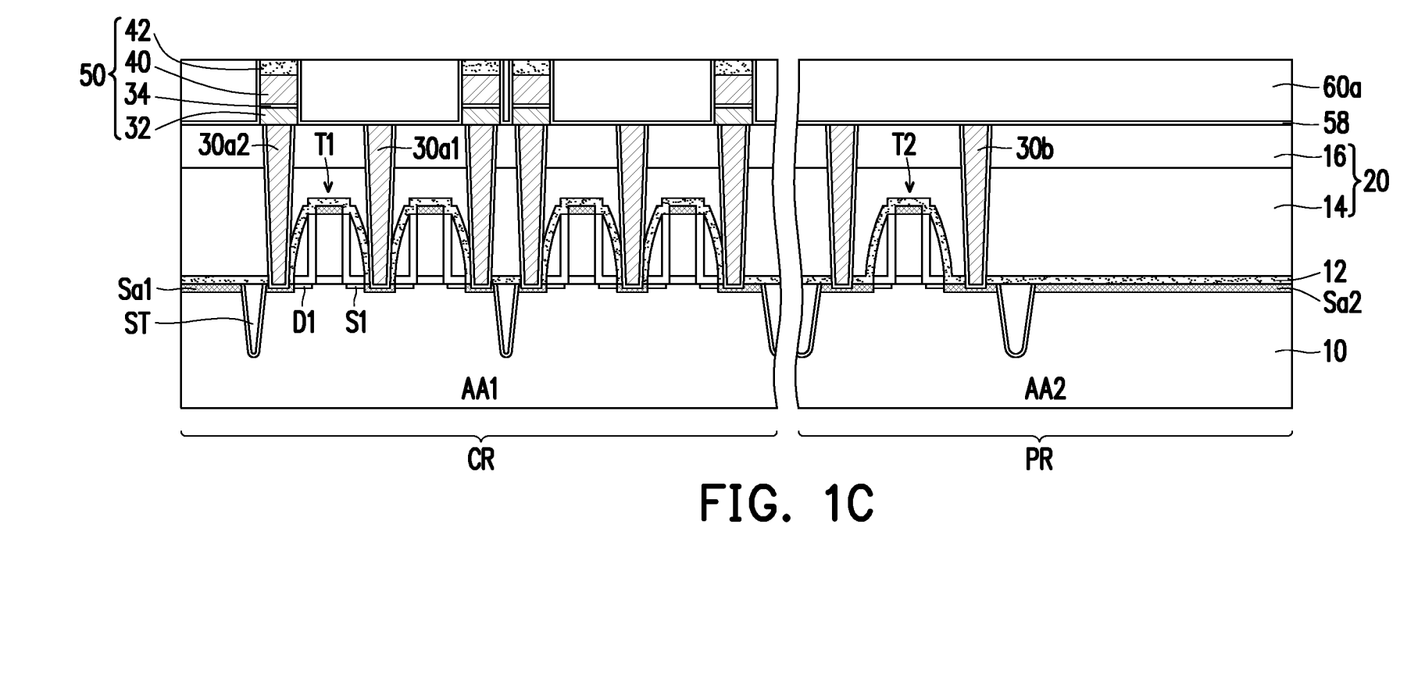

Referring to FIG. 1C, a planarization process is executed on the second inter-layer dielectric layer 60 to form a second inter-layer dielectric layer 60a with a flat surface. The second inter-layer dielectric layer 60a surrounds the memory elements 50. A top surface of the second inter-layer dielectric layer 60a and a top surface of the barrier layer 58 are coplanar with top surfaces of the top cover layers 42.

Figure 1D:
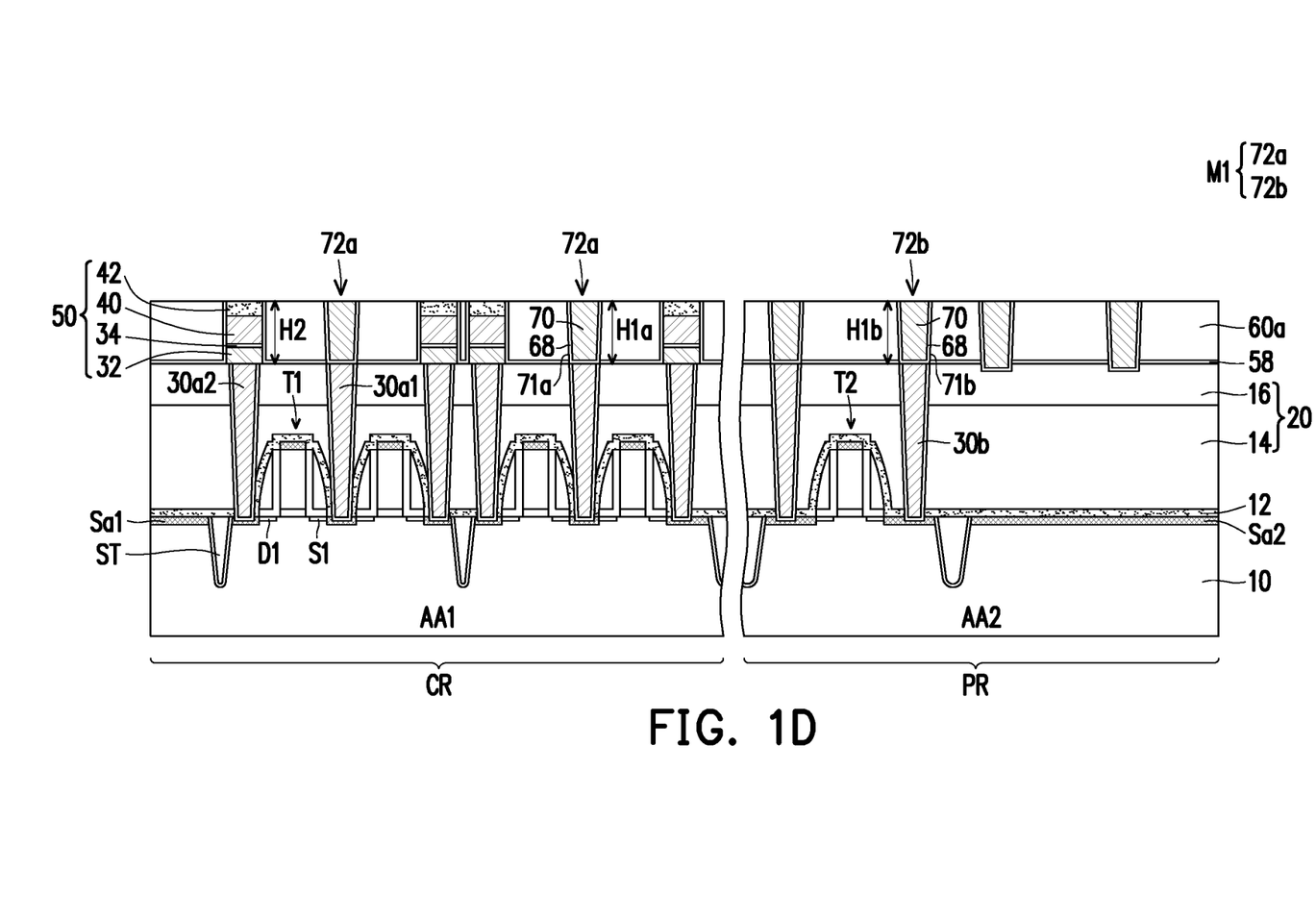

Referring to FIG. 1D, a first conductive line 72a is formed in the second inter-layer dielectric layer 60a and the barrier layer 58 in the memory cell region CR, and a first conductive line 72b is formed in the second inter-layer dielectric layer 60a in the peripheral region PR. The first conductive lines 72a and 72b are formed by the following method.

A first conductive line channel 71a and a first conductive line channel 71b are formed in the second inter-layer dielectric layer 60a and the barrier layer 58 through a lithographic anisotropic etching process. Then, a barrier material layer and a conductor material layer are formed on the first conductive line channel 71a, the first conductive line channel 71b and the second inter-layer dielectric layer 60a. The barrier material layer is, for example, titanium nitride formed by a chemical vapor deposition method. The conductor material layer is, for example, tungsten, aluminium, copper or a combination thereof formed by a physical vapor deposition method. Then, a chemical mechanical polishing process or an etching-back process is executed to remove the barrier material layer and the conductor material layer from the second inter-layer dielectric layer 60a, and in the first conductive line channels 71a and 71b, a first barrier layer 68 and a first conductor layer 70 are formed and the first conductive lines 72a and 72b are formed respectively.

Referring to FIG. 1D, the first conductive line 72a and the first conductive line 72b are together referred to as a first metal layer M1. The first conductive line 72a and the first conductive line 72b are lines or path lines extending along an XY plane. That is, the first conductive line 72a and the first conductive line 72b are substantially parallel to a surface of the substrate 10 and substantially perpendicular to a normal of the substrate 10. In addition, the first conductive line 72a and the first conductive line 72b are arranged at the same level as the memory elements 50. Here, the same level refers to the fact that top surfaces of the first conductive line 72a and the first conductive line 72b and top surfaces of the memory elements 50 are at the same level or substantially located on the same plane, or refers to the fact that bottom surfaces of the first conductive line 72a and the first conductive line 72b and bottom surfaces of the memory elements 50 are at the same level or substantially located on the same plane. Moreover, when the first conductive line channel 71a and the first conductive line channel 71b are formed, excessive etching may be performed, and thus the bottom surfaces of the first conductive line 72a and the first conductive line 72b may be slightly lower than the bottom surfaces of the memory elements 50. In other words, heights H1a and H1b of the first conductive line 72a and the first conductive line 72b may be equal to or slightly greater than heights H2 of the memory elements 50.

Figure 2:
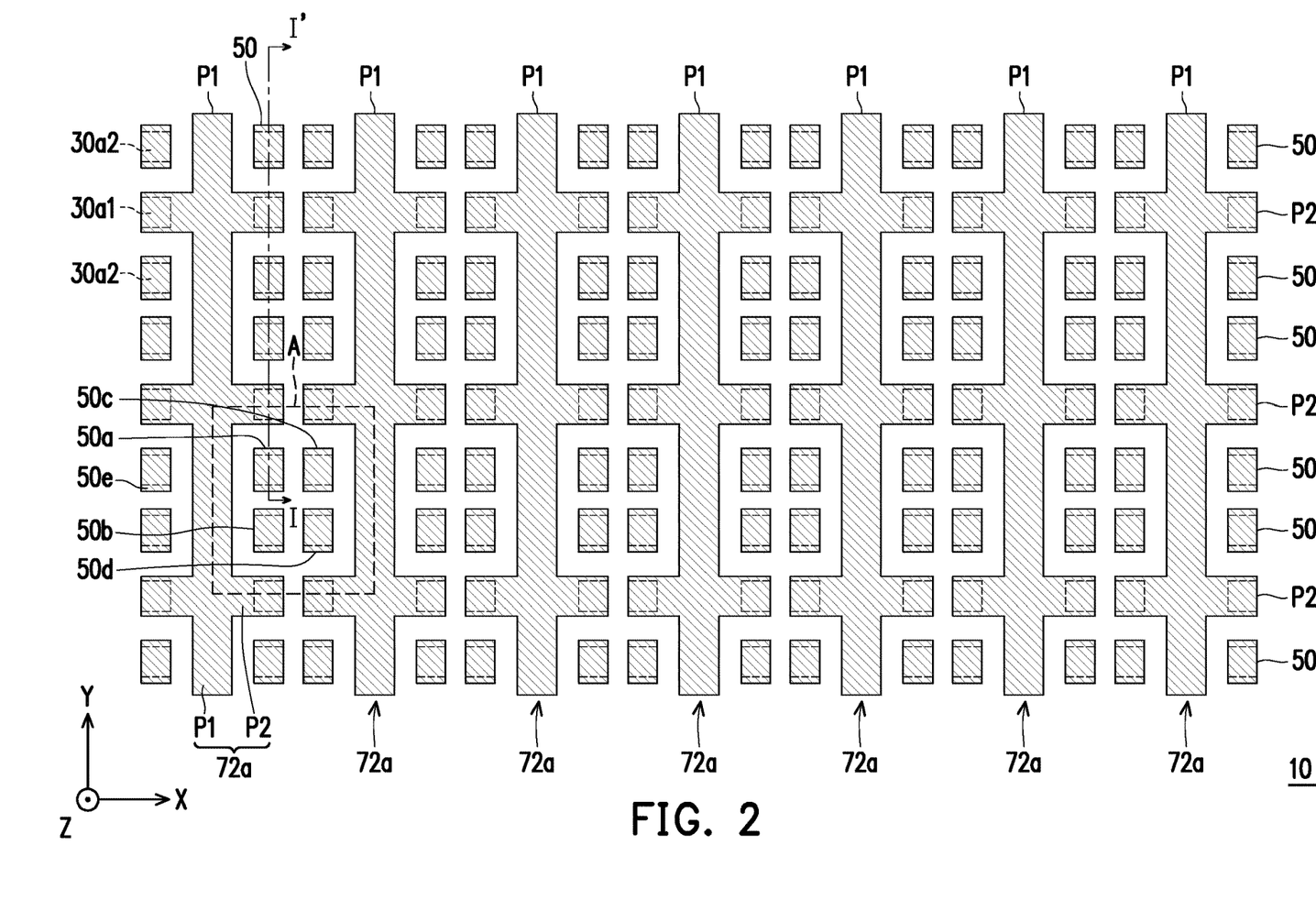
FIG. 2 is a top view of a semiconductor device according to an embodiment of the invention.

A cross-sectional view along a section line I-I' in FIG. 2 is shown by the memory cell region CR in FIG. 1D.

Referring to FIG. 1D and FIG. 2, a plurality of first conductive lines 72a and a plurality of memory elements 50 are provided on the substrate 10. Patterns of the first conductive lines 72a are different from patterns of the memory elements 50. For example, each memory element 50 is blocky or island-shaped and is in physical contact with a single contact 30a2; and each first conductive line 72a is double-row comb-shaped and may be in physical contact with a plurality of contacts 30a1. Each first conductive line 72a may include a main line portion P1 and a plurality of extending portions P2. The main line portion P1 extends along a first direction (for example, a Y-axis direction). A length of the main line portion P1 is several to dozens of times a length of the memory element 50. Each extending portion P2 extends along a second direction (for example, an X-axis direction) and is arranged along the first direction, penetrated through by the main line portion P1 and connected to the main line portion P1. Each extending portion P2 is in contact with two contacts 30a1, and each contact 30a1 is electrically connected to the first metal silicide layer Sa1 on a source region 51 shared by two first transistors T1 below.

The memory elements 50 may be arranged in an array. The memory elements 50 (for example, 50e and 50a) are arranged on two sides of the main line portions P1. In the X-axis direction, every two adjacent memory elements 50 (for example, 50a and 50c) are arranged alternately with the main line portions P1. In the Y-axis direction, every two adjacent memory elements 50 (for example, 50a and 50b) are arranged alternately with the extending portions P2.

The plurality of main line portions P1 of the plurality of first conductive lines 72a is arranged in parallel with one another. The plurality of extending portions P2 of the plurality of conductive lines 72a may be aligned with one another and arranged into a plurality of line segments extending along the second direction. In other words, the plurality of main line portions P1 and the plurality of extending portions P2 of the plurality of first conductive lines 72a may be arranged into a chessboard. A checker A of the chessboard is defined by two adjacent main line portions P1 and two adjacent extending portions P2 of each of the two main line portions P1. Four adjacent memory elements 50 (for example, 50a, 50b, 50c and 50d) are arranged in each checker A. The four adjacent memory elements 50 are electrically connected to the first metal silicide layers Sa1 on the drain regions D1 of four first transistors T1 through four contacts 30a2.

Figure 1E:
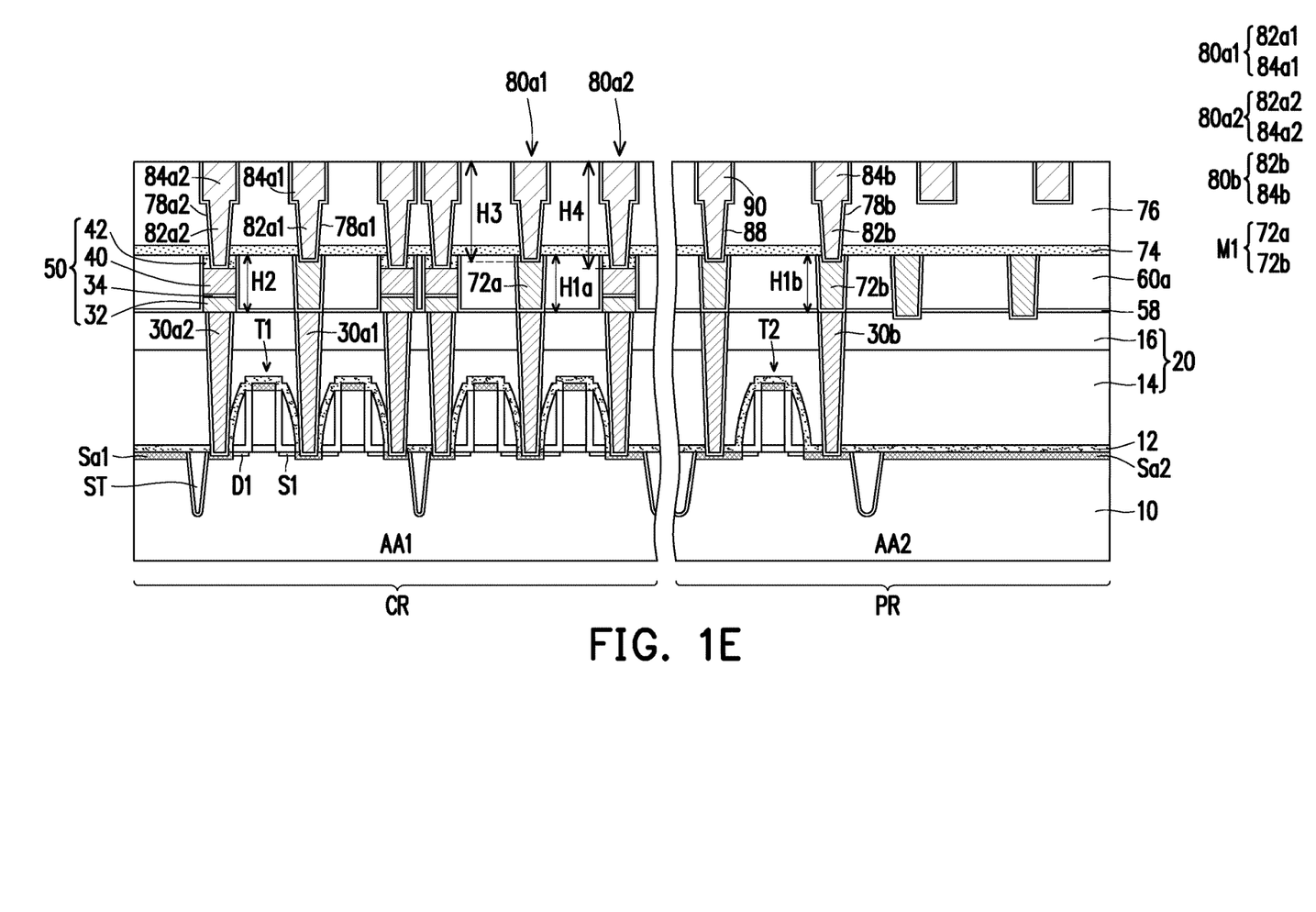

Referring to FIG. 1E, a second etch stop layer 74 and a first inter-metal dielectric layer 76 are formed on the substrate 10. The second etch stop layer 74 is, for example, a silicon carbide nitride (SiCN) layer. The first inter-metal dielectric layer 76 may be a single layer or multiple layers. The first inter-metal dielectric layer 76 is, for example, a silicon oxide layer formed by a chemical vapor deposition process and planarized by a planarization process.

Then, after part of the first inter-metal dielectric layer 76 is etched to be removed by taking the second etch stop layer 74 as an etch stop layer, part of the second etch stop layer 74 is removed to expose the first conductive line 72a, the top cover layers 42 of the memory elements 50 and the first conductive line 72b. Next, part of the top cover layers 42 are continued to be etched to form dual damascene openings 78a1, 78a2 and 78b. In an etching process of removing part of the top cover layers 42, the first conductive line 72a and the first conductive line 72b are hardly etched or only very small parts are etched. Therefore, an etching process for forming via openings of the dual damascene openings 78a2 located on the memory elements and via openings of the dual damascene openings 78a1 and 78b located on the first conductive lines may be controlled by a single step. The dual damascene openings 78a1, 78a2 and 78b expose the first conductive line 72a, the second electrode layers 40 of the memory elements 50 and the first conductive line 72b respectively.

Then, the barrier material layers and the conductor material layers are formed in the dual damascene openings 78a1, 78a2 and 78b. Later on, a chemical mechanical polishing process or an etching-back process is executed to remove the barrier material layer and the conductive material layer from the first inter-metal dielectric layer 76, and second barrier layers 88 and second conductor layers 90 left in the dual damascene openings 78a1, 78a2 and 78b form dual damascene structures 80a1, 80a2 and 80b respectively.

The dual damascene structure 80a1 includes a first via 82a1 and a second conductive line 84a1. The first via 82a1 is located in the first inter-metal dielectric layer 76, penetrates through the second etch stop layer 74 and is connected to the first conductive line 72a and the second conductive line 84a1. The dual damascene structure 80a2 includes a first via 82a2 and a second conductive line 84a2. The first via 82a2 is located in the first inter-metal dielectric layer 76, penetrates through the second etch stop layer 74 and the top cover layers 42 of the memory elements 50 and is connected to the second electrode layers 40 of the memory elements 50 and the second conductive line 84a2. The dual damascene structure 80b includes a first via 82b and a second conductive line 84b. The first via 82b is located in the first inter-metal dielectric layer 76, penetrates through the second etch stop layer 74 and is connected to the first conductive line 72b and the second conductive line 84b.

A size (width) of the first via 82a2 is substantially the same as that of the first via 82a1. In addition, a height H3 of the first via 82a1 is equal to a height H4 of the first via 82a2, or the height H4 of the first via 82a2 is slightly greater than the height H3 of the first via 82a1. The height H3 of the first via 82a1 may be 90% to 100% of the height H4 of the first via 82a2. Since the height H3 of the first via 82a1 and the height H4 of the first via 82a2 may not be too great and the first vias 82a still have enough bottom widths, contact resistance between the first via 82a1 and the first conductive line 72a or between the first via 82a and the memory element 50 is quite low.

Figure 1F:
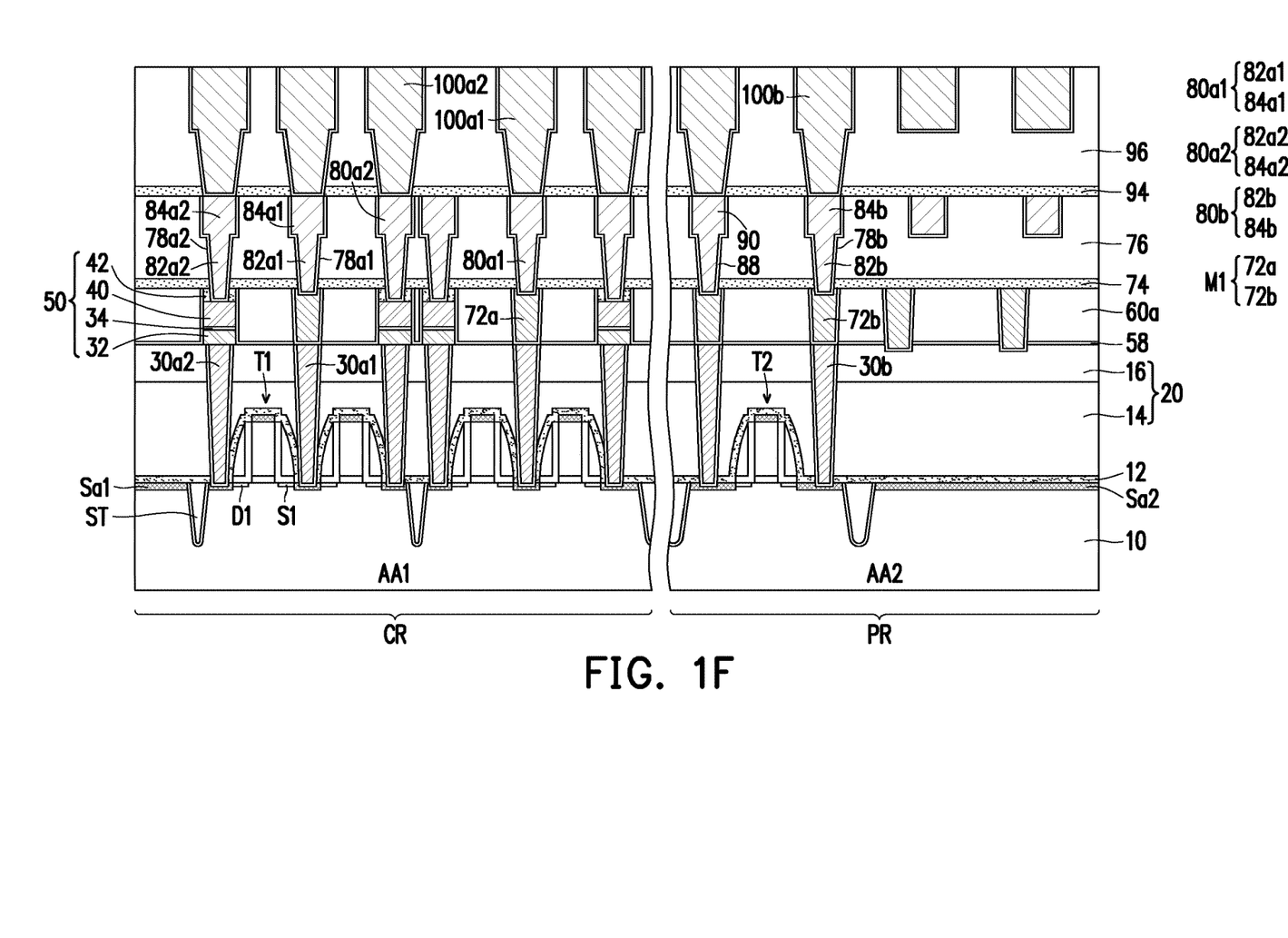

Referring to FIG. 1F, a third etch stop layer 94 and a second interlayer dielectric layer 96 are formed on the first inter-metal dielectric layer 76. Materials and forming method for the third etch stop layer 94 and the second interlayer dielectric layer 96 may be similar to the materials and forming method for the second etch stop layer 74 and the first inter-metal dielectric layer 76, and the elaborations thereof are omitted herein.

Then, dual damascene structures 100a1, 100a2 and 100b electrically connected to the dual damascene structures 80a1, 80a2 and 80b respectively are formed in the second interlayer dielectric layer 96 and the third etch stop layer 94 according to a method similar to that for forming the dual damascene structures 80a1, 80a2 and 80b. Top surfaces of the dual damascene structures 100a1, 100a2 and 100b and a top surface of the second interlayer dielectric layer 96 are substantially coplanar. Bottom surfaces of the dual damascene structures 100a1, 100a2 and 100b and a bottom surface of the third etch stop layer 94 are substantially coplanar.

Figure 1G:
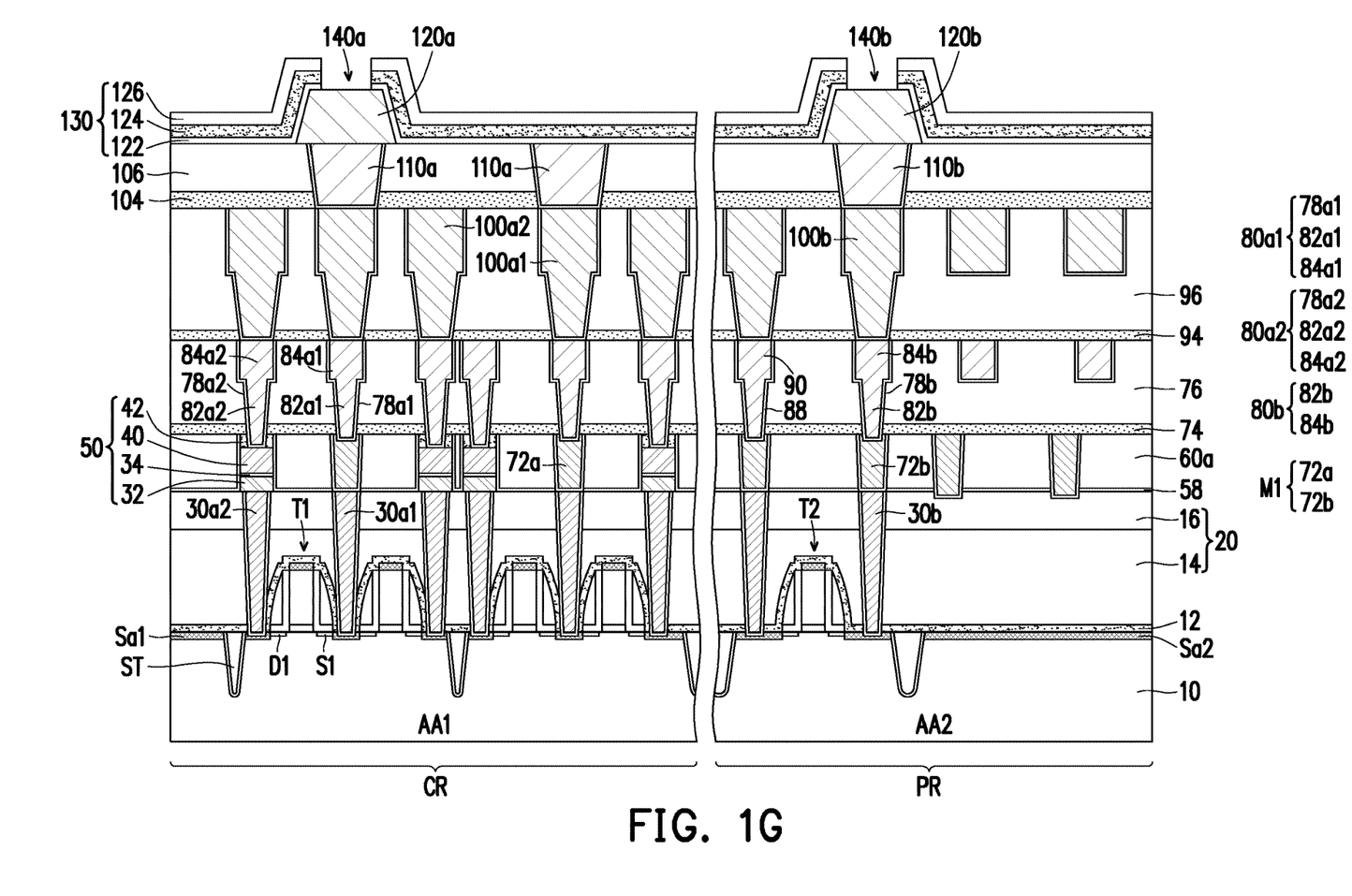

Referring to FIG. 1G, a fourth etch stop layer 104 and a top dielectric layer 106 are formed on the second interlayer dielectric layer 96. Materials and forming method for the fourth etch stop layer 104 and the top dielectric layer 106 may be similar to the materials and forming method for the second etch stop layer 74 and the first inter-metal dielectric layer 76, and the elaborations thereof are omitted herein. Then, vias 110a and 110b are formed in the top dielectric layer 106 and the fourth etch stop layer 104 to be electrically connected to the dual damascene structures 100a1 and 100b respectively. Next, pads 120a and 120b are formed on the vias 110a and 110b respectively. Materials for the pads 120a and 120b may include aluminium. Later on, a passivation layer 130 is formed. Materials for the passivation layer 130 may include silicon nitride. In an embodiment, the passivation layer 130 includes a silicon nitride layer 122, a silicon oxide layer 124 and a silicon nitride layer 126. Then, top vias (TV) 140a and 140b are formed in the passivation layer 130. The vias 110a and 110b, the pads 120a and 120b and the passivation layer 130 may be formed by any known method, and the elaborations thereof are omitted herein.

In the above embodiment, descriptions are made with the memory elements and the first metal layer (first conductive lines) arranged at the same level as an example. However, in other embodiments, the memory elements may be arranged at the same level as any metal layer (for example, a second metal layer and a third metal layer) below a top metal layer.

Figure 3:
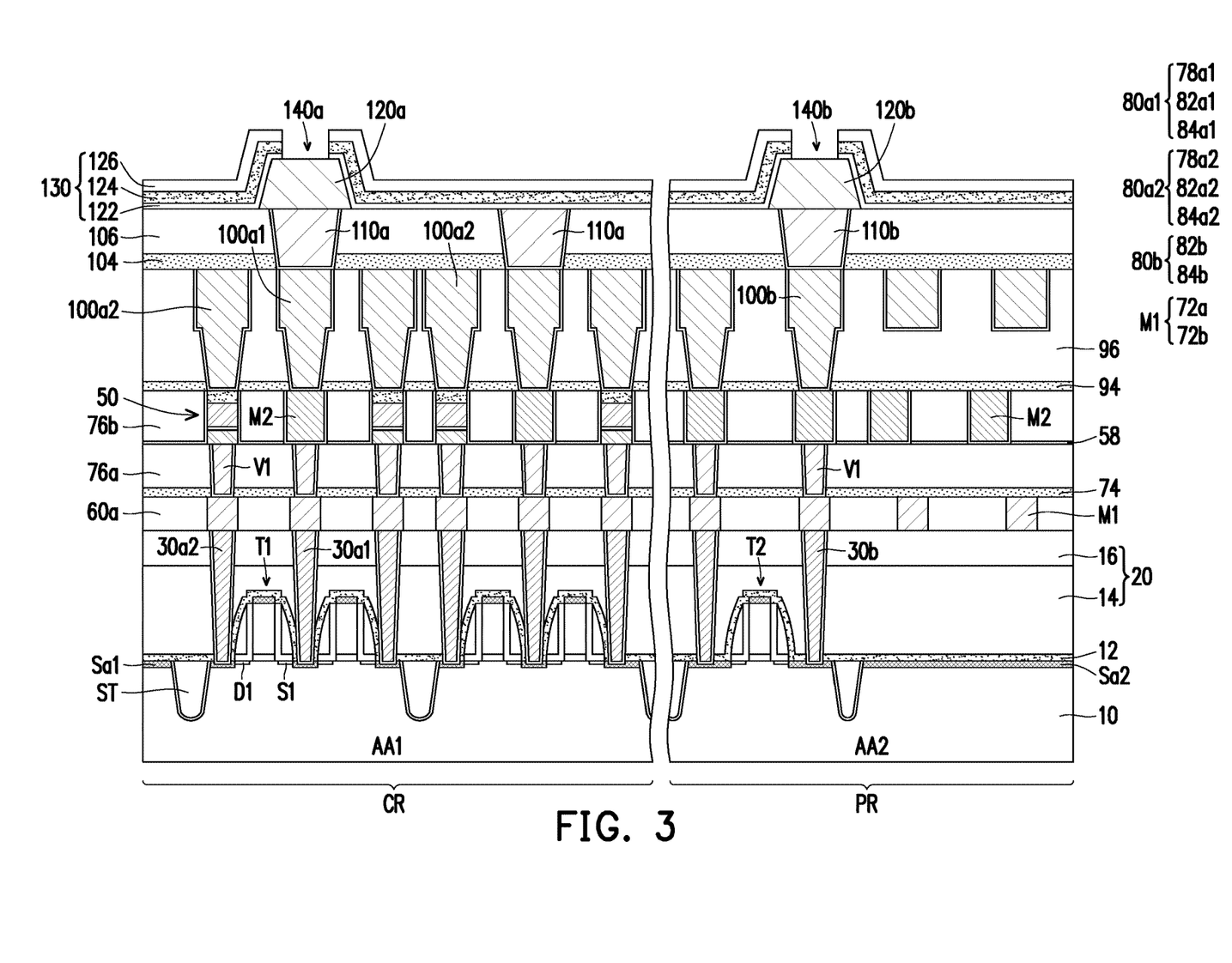
FIG. 3 is a cross-sectional view of a semiconductor device according to another embodiment of the invention.

Referring to FIG. 3, for example, after the first metal layer (first conductive lines) M1 and the second inter-layer dielectric layer 60a are formed, an inter-metal dielectric layer 76a is formed first. Then, a first via V1 is formed in the inter-metal dielectric layer 76a. Next, the memory elements 50 are formed according to the foregoing method, and an inter-metal dielectric layer 76b is formed. Later on, a second metal layer M2 is formed in the inter-metal dielectric layer 76b. Finally, a third etch stop layer 94 is formed and subsequent processes are executed according to the foregoing method to complete fabrication of a semiconductor device. In the present embodiment, levels of top surfaces of the memory elements 50 and a top surface of the second metal layer M2 are substantially the same or substantially located on the same plane.

According to the embodiments of the invention, the memory elements and the conductive lines (metal layer) are arranged at the same level in the semiconductor device, and the heights of the memory elements are substantially the same as the heights of the conductive lines. As a result, a difference between the heights of the via openings on the memory elements and the via openings on the conductive lines is small. Therefore, the etching process for forming the via openings on the memory elements and the via openings on the conductive lines may be controlled by the single step. In addition, the sizes of the vias on the memory elements and the vias on the conductive lines are substantially the same. Moreover, the contact resistance between the vias and the conductive lines or the memory elements is quite low.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A semiconductor device, comprising:
a plurality of doped regions, located in a substrate;
a first dielectric layer, located on the substrate;
a plurality of first contacts and second contacts, located in the first dielectric layer and connected to the plurality of doped regions;
a second dielectric layer, located on the first dielectric layer;
a memory element, located in the second dielectric layer, the memory element being electrically connected to the second contact;
a conductive line, located in the second dielectric layer, the conductive line being electrically connected to the plurality of first contacts, a bottom surface of the conductive line being at a same level as a bottom surface of the memory element, and a top surface of the conductive line being at a same level as a top surface of the memory element;
an etch stop layer, located on the second dielectric layer;
a first inter-metal dielectric layer, located on the etch stop layer; and
a first dual damascene structure and a second dual damascene structure, located in the first inter-metal dielectric layer and the etch stop layer, the first dual damascene structure being connected to the conductive line and the second dual damascene structure being connected to the memory element, wherein a maximum height of the second dual damascene structure on the top surface of the memory element is greater than a maximum height of the first dual damascene structure, and
there is an interface between the first dual damascene structure and the conductive line,
wherein the conductive line is double-row comb-shaped on the substrate, and comprises:
a main line portion, extending along a first direction; and
a plurality of extending portions, extending along a second direction, arranged along the first direction, and penetrated through by the main line portion and connected to the main line portion and the plurality of first contacts,
wherein the memory element is blocky or island-shaped and arranged on two sides of the main line portion on the substrate.

2. The semiconductor device according to claim 1, wherein a top surface of the second dielectric layer is coplanar with the top surface of the conductive line and a top surface of a top cover layer of the memory element.

3. The semiconductor device according to claim 2, wherein the conductive line is in physical contact with the plurality of first contacts, and the memory element is in physical contact with the second contact.

4. The semiconductor device according to claim 2, wherein the second dual damascene structure penetrates through the top cover layer of the memory element and is electrically connected to an electrode layer below the top cover layer.

5. The semiconductor device according to claim 1, further comprising:
a metal layer, arranged below the conductive line and the memory element and being in physical contact with the first contact; and
a plurality of vias, arranged between the metal layer and the conductive line and between the metal layer and the memory element.

6. The semiconductor device according to claim 1, wherein the conductive line comprises:
a main line portion, extending along a first direction; and
a plurality of extending portions, extending along a second direction, arranged along the first direction and connected to the main line portion and the plurality of first contacts.

* * * * *